United States Patent
Bui et al.

(10) Patent No.: US 7,470,966 B2
(45) Date of Patent: Dec. 30, 2008

(54) PHOTODIODE WITH CONTROLLED CURRENT LEAKAGE

(75) Inventors: Peter Steven Bui, Westminster, CA (US); Narayan Dass Taneja, Long Beach, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 0 days.

(21) Appl. No.: 11/774,002

(22) Filed: Jul. 6, 2007

(65) Prior Publication Data

US 2007/0257329 A1   Nov. 8, 2007

(51) Int. Cl.
    *H01L 31/06* (2006.01)
(52) U.S. Cl. .................. 257/461; 257/428; 257/431
(58) Field of Classification Search .................. 257/428, 257/431, 461
    See application file for complete search history.

(56) References Cited

U.S. PATENT DOCUMENTS

| | | | |
|---|---|---|---|
| 4,874,939 A | 10/1989 | Nishimoto et al. | |
| 4,887,140 A | 12/1989 | Wang | |
| 4,904,608 A | 2/1990 | Gentner et al. | |
| 4,904,861 A | 2/1990 | Epstein et al. | |
| 4,998,013 A | 3/1991 | Epstein et al. | |
| 5,049,962 A * | 9/1991 | Huang et al. ................ 257/463 |
| 5,144,379 A | 9/1992 | Eshita et al. | |
| 5,214,276 A | 5/1993 | Himoto et al. | |
| 5,252,142 A | 10/1993 | Matsuyama et al. | |
| 5,408,122 A * | 4/1995 | Reele ........................ 257/446 |
| 5,430,321 A | 7/1995 | Effelsberg | |
| 5,446,751 A | 8/1995 | Wake | |
| 5,576,559 A | 11/1996 | Davis | |
| 5,599,389 A | 2/1997 | Iwasaki | |
| 5,818,096 A | 10/1998 | Ishibashi et al. | |
| 5,825,047 A | 10/1998 | Ajisawa et al. | |
| 5,869,834 A | 2/1999 | Wipenmyr | |
| 5,923,720 A | 7/1999 | Barton et al. | |
| 6,218,684 B1 * | 4/2001 | Kuhara et al. ............... 257/184 |
| 6,326,649 B1 | 12/2001 | Chang et al. | |
| 6,352,517 B1 | 3/2002 | Flock et al. | |
| 6,426,991 B1 | 7/2002 | Mattson et al. | |
| 6,438,296 B1 | 8/2002 | Kongable | |
| 6,489,635 B1 | 12/2002 | Sugg | |
| 6,504,158 B2 * | 1/2003 | Possin ................... 250/370.09 |
| 6,510,195 B1 | 1/2003 | Chappo et al. | |
| 6,546,171 B2 | 4/2003 | Fukutomi | |
| 6,569,700 B2 | 5/2003 | Yang | |
| 6,670,258 B2 | 12/2003 | Carlson et al. | |
| 6,734,416 B2 | 5/2004 | Carlson et al. | |

(Continued)

FOREIGN PATENT DOCUMENTS

EP    0 347 157    12/1989

(Continued)

*Primary Examiner*—Long Pham
(74) *Attorney, Agent, or Firm*—PatentMetrix

(57) ABSTRACT

The present invention is directed towards radiation detectors and methods of detecting incident radiation. In particular the present invention is directed towards photodiodes with controlled current leakage detector structures and a method of manufacturing photodiodes with controlled current leakage detector structures. The photodiodes of the present invention are advantageous in that they have special structures to substantially reduce detection of stray light. Additionally, the present invention gives special emphasis to the design, fabrication, and use of photodiodes with controlled leakage current.

14 Claims, 6 Drawing Sheets

U.S. PATENT DOCUMENTS

| | | |
|---|---|---|
| 7,057,254 B2 * | 6/2006 | Bui et al. .................... 257/443 |
| 7,256,470 B2 * | 8/2007 | Bui et al. .................... 257/461 |
| 2002/0056845 A1 | 5/2002 | Iguchi et al. |
| 2004/0222358 A1 * | 11/2004 | Bui et al. ................. 250/214.1 |
| 2004/0222482 A1 * | 11/2004 | Bui et al. .................... 257/461 |

FOREIGN PATENT DOCUMENTS

| | | |
|---|---|---|
| EP | 0 723 301 A2 | 5/1997 |
| EP | 0 723 301 B1 | 7/2000 |
| EP | 1 069 626 A2 | 1/2001 |
| EP | 1 205 983 A1 | 5/2002 |
| WO | WO/00/52766 | 9/2000 |

\* cited by examiner

PHOTODIODE WITH CONTROLLED CURRENT LEAKAGE

FIELD OF THE INVENTION

The present invention pertains generally to the field of radiation detectors, and in particular, relates to photodiodes with controlled current leakage.

BACKGROUND OF THE INVENTION

Certain photodiodes have two-electrode radiation-sensitive junctions formed in semiconductor material. Light, which illuminates the junction, creates charge carriers. Reverse current varies with illumination. Photodiodes can be photovoltaic or photoconductive devices, used for detection of optical power and subsequent conversion to electrical power.

Operationally, photodiodes absorb photons or charged particles, facilitating detection of incident optical power and generating current proportional to the incident power, thus converting the incident optical power to electrical power. Light-induced current of the photodiode corresponds to the signal while "dark" current represents noise. "Dark" current is that current that is not induced by light, or that is present in the absence of light. Photodiodes process signals by using the magnitude of the signal-to-noise ratio.

Photodiodes are typically characterized by certain parameters, such as, among others, electrical characteristics, optical characteristics, current characteristics, voltage characteristics, and noise. Electrical characteristics predominantly comprise shunt resistance, series resistance, junction capacitance, rise or fall time and/or frequency response. Optical characteristics comprise responsivity, quantum efficiency, non-uniformity, and/or non-linearity. Photodiode noise may comprise, among others, thermal noise, quantum, photon or shot noise, and/or flicker noise.

Conventionally, in an effort to increase the signal to noise ratio and enhance the contrast of the signal, it is desirable to increase the light-induced current of photodiodes. Thus, photodiode sensitivity is enhanced while the overall quality of the photodiode is improved. Photodiode sensitivity is crucial in low-level light applications and is typically quantified by a parameter referred to as noise equivalent power (NEP), which is defined as the optical power that produces a signal-to-noise ratio of one at the detector output. NEP is usually specified at a given wavelength over a frequency bandwidth.

Essentially active solid-state semiconductor devices, and in particular, silicon photodiodes, are among the most popular photodetectors having a sufficiently high performance over a wide wavelength range with ease of use. Silicon photodiodes are sensitive to light in the wide spectral range, approximately $200*10^{-9}$ m to $1100*10^{-9}$ m, extending from deep ultraviolet through visible to near infrared. Silicon photodiodes, by using their ability to detect the presence or absence of minute light intensities, facilitate the extremely precise measurement of these minute light intensities upon appropriate calibration. For example, appropriately calibrated silicon photodiodes detect and measure light intensities varying over a wide range, from very minute light intensities of below $10^{-13}$ watts/$cm^2$ to high intensities above $10^{-3}$ watts/$cm^2$.

Conventional photodiodes, as described above, still present numerous problems in their use today. Many of the resources associated with the use of conventional photodiodes, including capital, time, and manpower are wasted in resolving some of the numerous problems including controlling (also referred to as modifying, managing, reducing or eliminating) photodiode leakage current, noise, and stray light. In addition, there are secondary problems that pose problems in conventional photodiode use. These include, but are not limited to, determination and/or selection of apt active area specifications and controlling the higher-wavelength infrared response.

A particularly serious problem associated with conventional photodiodes is leakage current. Leakage current is a major source of signal offset and noise in applications operating in current mode. More specifically, leakage current flows through the photodiode when it is in a "dark" state, or in the absence of light at a given reverse bias voltage applied across the junction. Leakage current is specified at a particular value of reverse applied voltage. For example, reverse bias voltage may be as low as 10 mV or as high as 50 V, whereas the "dark" currents may vary from pA to µA depending upon the junction area and the process used. Leakage current is temperature dependent; thus, an increase in temperature and reverse bias results in an increase in leakage or dark current. A general rule is that the dark current will approximately double for every 10° C. increase in ambient temperature. It should be noted, however, that specific diode types can vary considerably from this relationship. For example, it is possible that leakage or dark current will approximately double for every 6° C. increase in temperature.

Various approaches have been used in the prior art to reduce, eliminate or control leakage current. For example, U.S. Pat. No. 4,904,861, assigned to Agilent Technologies, Inc., discloses "an optical encoder comprising: a plurality of active photodiodes in an array on a semiconductor chip; a code member having alternating areas for alternately illuminating and not illuminating the active photodiodes in response to movement of the code member; means connected to the active photodiodes for measuring current from the active photodiodes; and sufficient inactive photodiode area on the semiconductor chip at each end of the array of active photodiodes to make the leakage current to each end active photodiode of the array substantially equal to the leakage current to an active photodiode remote from an end of the array". Similarly, U.S. Pat. No. 4,998,013, also assigned to Agilent Technologies, Inc. discloses "means for shielding a photodiode from leakage current comprising: at least one active photodiode on a semiconductor chip; means for measuring current from the active photodiode; a shielding area having a photodiode junction substantially surrounding the active photodiode; and means for biasing the shielding area photodiode junction with either zero bias or reverse bias."

U.S. Pat. No. 6,670,258, assigned to Digirad Corporation, discloses "a method of fabricating a low-leakage current photodiode array comprising: defining frontside structures for a photodiode on a front side of a substrate; forming a heavily-doped gettering layer on a back surface of the substrate; carrying out a gettering process on the substrate to transport undesired components from the substrate to said gettering layer, and to form another layer in addition to said gettering layer, which is a heavily-doped, conductive, crystalline layer within the substrate; after said gettering process, removing the entire gettering layer; and after said removing, thinning the heavily-doped, conductive, crystalline layer within the substrate to create a native optically transparent, conductive bias electrode layer".

Similarly, U.S. Pat. No. 6,734,416, also assigned to Digirad Corporation, discloses "a low-leakage current photodiode array comprising: a substrate having a front side and a back side; a plurality of gate regions formed near the front side of the substrate; a backside layer formed within the substrate, near the back side of the substrate, the backside layer having a thickness of approximately 0.25 to 1.0 micrometers and having a sheet resistivity of approximately 50 to 1000 Ohm per square."

U.S. Pat. No. 6,569,700, assigned to United Microelectronics Corporation in Taiwan, discloses "1. A method of reducing leakage current of a photodiode on a semiconductor wafer, the surface of the semiconductor wafer comprising a p-type substrate, a photosensing area for forming a photosensor of the photodiode, and a shallow trench positioned in the substrate surrounding the photosensing area, the method comprising: forming a doped polysilicon layer containing p-type dopants in the shallow trench; using a thermal process to cause the p-type dopants in the doped polysilicon layer to diffuse into portions of the p-type substrate that surround a bottom of the shallow trench and walls of the shallow trench; removing the doped polysilicon layer; filling an insulator into the shallow trench to form a shallow trench isolation (STI) structure; performing a first ion implantation process to form a first n-type doped region in the photosensing area; and performing a second ion implantation process to form a second n-type doped region in the photosensing area."

Also, U.S. Pat. No. 6,504,158, assigned to General Electric Company, discloses "a method of reducing leakage current in an imaging apparatus, including: providing a substrate with at least one radiation-sensitive imaging region therein; forming a guard region in the substrate at or immediately adjacent a cut edge of the substrate to reduce leakage current reaching the at least one radiation-sensitive imaging region from the cut edge when the imaging apparatus is in use; and electrically reverse biasing the at least one radiation-sensitive imaging region and the guard region relative to the substrate."

In addition to leakage current, noise is often a limiting factor for the performance of any device or system. In almost every area of measurement, the limit to the detectability of signals is set by noise, or unwanted signals that obscure the desired signal. As described above, the NEP is used to quantify detector noise. Noise issues generally have an important effect on device or system cost. For example, the reduction of quantum or shot noise influence in interferometers for gravitational wave detection greatly lessens required interferometer arm length. Conventional photodiodes are particularly sensitive to noise issues. Like other types of light sensors, the lower limits of light detection for photodiodes are determined by the noise characteristics of the device.

As described above, the typical noise components in photodiodes include thermal noise; quantum or shot noise; and flicker noise in that order. These noise components collectively contribute to the total noise in the photodiode. Thermal noise, or Johnson noise, is inversely related to the value of the shunt resistance of photodiode and tends to be the dominant noise component when the diode is operated under zero applied reverse bias conditions. Shot noise is dependent upon the leakage or dark current of photodiode and is generated by random fluctuations of current flowing through the device, which may be either dark current or photocurrent. Shot noise tends to dominate when the photodiode is used in photoconductive mode where an external reverse bias is applied across the device. As an example, detector noise generated by a planar diffused photodiode operating in the reverse bias mode is a combination of both shot noise and thermal noise. Flicker noise, unlike thermal or shot noise, bears an inverse relationship to spectral density. Flicker noise may dominate when the bandwidth of interest contains frequencies less than 1 kHz.

In addition to leakage current and noise issues, photodiodes are susceptible to absorption of unwanted or stray light. Stray light is typically that light which propagates through a path other than that which is intended (thus reaching the detector) and excludes the wavelength of interest or an erroneous wavelength. Stray light activates a signal at the detector element. Some of the recognized sources of stray light include ambient light, scattering light from imperfect optical components and/or reflections of non-optical components. The ambient or stray light is assumed to be stationary or slowly fluctuating. Stationary ambient light engenders shot noise, owing to the statistical nature of the production of photocarriers upon impinging on the photodetector. In certain circumstances, the photodiode is exposed to ambient or stray light thus resulting in a high level of noise. Additionally, stray light influences the signal-to-noise ratio (S/N or SNR) and introduces non-linearity.

While photodiodes have a wide viewing angle, many applications require the detection of desired light and concurrent rejection of stray light. Stray light absorption significantly contributes to the total photocurrent delivered by a small active area photodiode and renders it not usable. For example, photodiodes typically used in medical applications need to deliver a precise ratio of photocurrents illuminated from 660 nm and 880 nm. It is possible that an incorrect ratio of photocurrents will be delivered due to the absorption or collection of stray light by the photodiode.

Some attempts have been made in the prior art to correct for the effects of stray light. For example, U.S. Pat. No. 5,869,834, assigned to Sitek Electro Optics, discloses "a position-sensitive photodetector for measuring the position of an incident light beam having energy, comprising: a semiconductor wafer having a doped active surface and a pair of ends; a resistive layer on the active surface of the wafer; two opposed electrodes on each end of said active surface; a stray-light area arranged externally around the active surface, said stray-light area for measuring stray-light contacting said photodetector and for preventing said stray light from affecting a position measuring signal of said incident light beam, said stray light area comprising a doped area containing a p-n junction and a grounding electrode attached thereto, the signal from said stray light area being grounded; a first inactive area externally surrounding said stray-light area and a second inactive area disposed between said active area and said stray-light area, each inactive area connected to said same ground as said stray-light area."

Also, U.S. Pat. No. 6,546,171, assigned to NEC Corporation, discloses "a structure for shielding a stray light in an optical waveguide module, comprising: an optical waveguide substrate supported in an optical waveguide module package; a laser diode (LD) which is mounted on said optical waveguide substrate and emits a first signal light; an optical waveguide which is formed on said optical waveguide substrate and propagates a part of said first signal light; a wavelength divisional multiplexing (WDM, hereinafter) filter which is formed on said optical waveguide substrate; an optical fiber which is situated on said optical waveguide substrate and transmits said part of said first signal light to an optical transmission line; a photodiode (PD, hereinafter) for receiving a second signal light which is propagated through said optical transmission line and transmitted through said WDM filter via said optical waveguide; and a metallic layer which is evaporated on a surface of said WDM filter and provided with a pin hole for transmitting said second signal light to said PD via said WDM filter, wherein a remaining part of said first signal light (a stray light, hereinafter) which is not optically coupled with said optical waveguide is reflected by said metallic layer so that said stray light is prevented from being coupled with said PD."

As discussed earlier, secondary issues also contribute to dark noise and other noise sources that impact photodiode sensitivity. These include primarily determination and/or selection of apt active area specifications (geometry and dimensions), response speed, quantum efficiency at the wavelength of interest, response linearity, and spatial uniformity of response, among others.

While methods and systems of the prior art described above may improve performance, they do not effectively control leakage current, which is equally important to high-performance as well as low-standby and low-power operation devices. Thus, there is still a need for photodiodes with controlled leakage current. Additionally, there is need for low-voltage, low-power designs vis-à-vis photodiodes with aggressive techniques for controlling leakage current. In addition, in spite of the attempts in the prior art, as described above, to reduce or eliminate the effects of stray light absorption with respect to photodiodes, no attempt has been made to design and fabricate photodiodes with special structures to completely avoid stray light.

Thus, there is a need for the design and implementation of methods and apparatuses which completely avoid stray light absorption, reduce or eliminate noise, and control leakage current while lessening the effects of these noise contributing factors. More specifically, what is needed is a photodiode design and fabrication method intended for applications wherein a small active area is employed and wherein a complete avoidance of stray light is of greater importance.

SUMMARY

It is an object of the present invention to design and manufacture photodiodes with controlled leakage current. More specifically, the present invention provides low-voltage, low-power photodiodes with aggressive and effective techniques for controlling leakage current. It is also an object of the present invention to provide a method of reducing leakage current of a photodiode that increases signal-to-noise ratio and sensitivity. Thus, the present invention also reduces or nullifies noise in photodiodes.

Yet another object of the present invention is to design and fabricate photodiodes with special structures to completely avoid detection of stray light. Also, it an objective of the present invention to reduce or minimize, and even more preferably, avoid, stray light absorption.

In one embodiment, the present invention is a photodiode array comprising a substrate having at least a front side and a back side; a plurality of photodiodes integrally formed in the substrate forming said array; a plurality of electrical contacts in electrical communication with said front side; a plurality of suction diodes positioned at selected locations within the array; and at least one metal layer on said array, wherein the fabrication of said array involves a masking process comprising the steps of applying a first metallization layer on said front side and applying a second metallization layer on said front side and subsequently creating an aperture to an active area.

In another embodiment, the present invention is a photodiode array comprising a substrate having at least a front side and a back side; a plurality of photodiodes integrally formed in the substrate forming the said array; a plurality of electrical contacts in electrical communication with said front side; and a plurality of suction diodes positioned at selected locations within the array, wherein the fabrication of said array involves a masking process comprising the steps of applying a n+ mask on said front side, applying a p+ mask on said front side, applying a first metal layer of said front side, applying an insulation layer on said front side, and applying a second metal layer on said front side.

Optionally, the second metallization layer on the front side substantially prevents stray light from impinging upon the areas surrounding the active area. The substrate is made of n-doped silicon. Each of the plurality of photodiodes and suction diodes have a front surface and the front surface is partially covered by passivated oxidized junction, an insulating layer, and a first metal layer. The insulating layer is a polymide. The insulating layer is a low temperature oxide or nitride layer. The front side optionally comprises a n+ layer in electrical communication with a metal to form a cathode. The front layer comprises a doped material of p+ conductivity type. The front p+ layer is in electrical communication with a metal to form an anode.

In one embodiment, the present invention includes a photodiode array comprising a substrate having at least a front side and a back side; a plurality of photodiodes integrally formed in the substrate forming the array; a plurality of electrical contacts in electrical communication with the front side; and a plurality of suction diodes positioned at selected locations within the array. The fabrication of the array involves a masking process comprising the steps of applying a n+ mask on said front side, applying a p+ mask on the front side, applying a first metal layer of the front side, applying an insulation layer on the front side, and applying a second metal layer on the front side.

Optionally, the masking process further comprises etching the second metal layer to form an aperture leading to an active area on the photodiode. The second metal layer prevents stray light from impinging on the areas surrounding the active area. The front layer comprises a doped material of n+ conductivity type. The front n+ layer is in electrical communication with a metal to form a cathode. The front layer comprises a doped material of p+ conductivity type. The front p+ layer is in electrical communication with a metal to form a cathode. The insulation layer is a polymide.

Although several embodiments that remedy the aforementioned shortcomings in connection to the photodiodes will be readily apparent to those of ordinary skill in the art, the disclosure set forth herein may be applicable to other embodiments and applications without departing from the spirit and scope of the present invention and the claims hereto appended.

BRIEF DESCRIPTION OF DRAWINGS

These and other features and advantages of the present invention will be appreciated, as they become better understood by reference to the following Detailed Description when considered in connection with the accompanying drawings, wherein:

FIG. 1b is a top view of the small active area photodiode of FIG. 1a;

DESCRIPTION OF THE INVENTION

The present invention is directed towards radiation detectors and methods of detecting incident radiation. In particular the present invention is directed towards photodiodes with controlled current leakage detector structures and a method of manufacturing photodiodes with controlled current leakage detector structures. More specifically, the present invention discloses photodiodes with special structures to substantially reduce detection of stray light. Additionally, the present invention gives special emphasis to design, fabrication, and use of photodiodes with controlled leakage current.

Various modifications to the preferred embodiment, disclosed herein, will be readily apparent to those of ordinary skill in the art and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

Conventionally, the active area in detectors is either of a round or square shape. There is no restriction on the shape of these active areas, however. Many applications may require triangular, radial, or trapezoidal shapes. Conventional photodiodes are manufactured via standard wafer fabrication techniques involving methods of masking and photoetching; thus, it is relatively simple to create a unique geometry. The geometric size and shape of the active area can be held to tolerances of 2 microns. As described herein, the term "region" is used interchangeably with the term "area" and refers to discrete portions within the photodiode chip.

In a conventional prior art embodiment, a small active area silicon photodiode is designed and fabricated using standard technology. The specifications of the designated active area include shape and dimension specifics. Other parameters that are carefully designed are those which comprise significant performance characteristics of photodiodes, including but not limited to, response speed, quantum efficiency at the wavelength of interest, response linearity, spatial uniformity of response, dark noise or other noise sources that impact photodiode noise equivalent power.

Figure 1A:
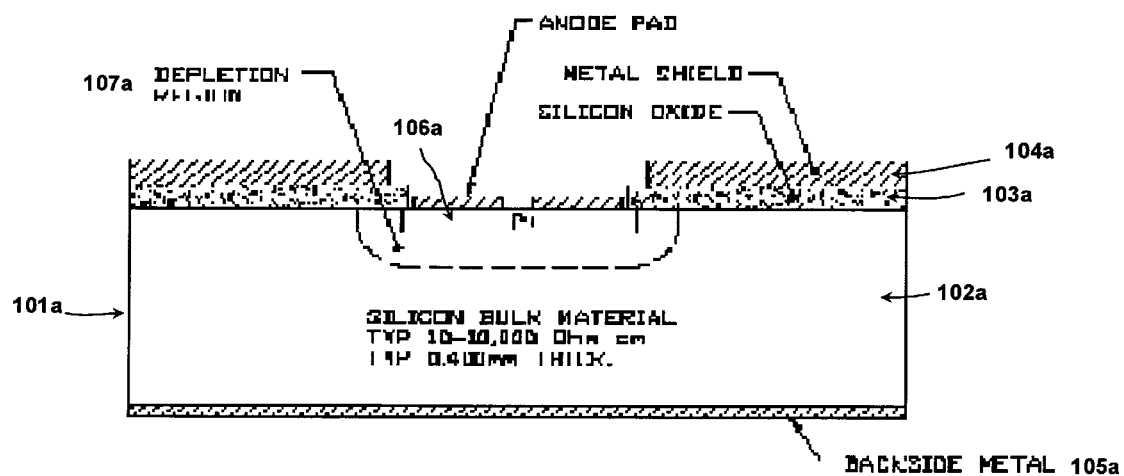
FIG. 1a is a cross-sectional view of a conventional small active area photodiode, designed and fabricated using standard technology.
Figure 1B:
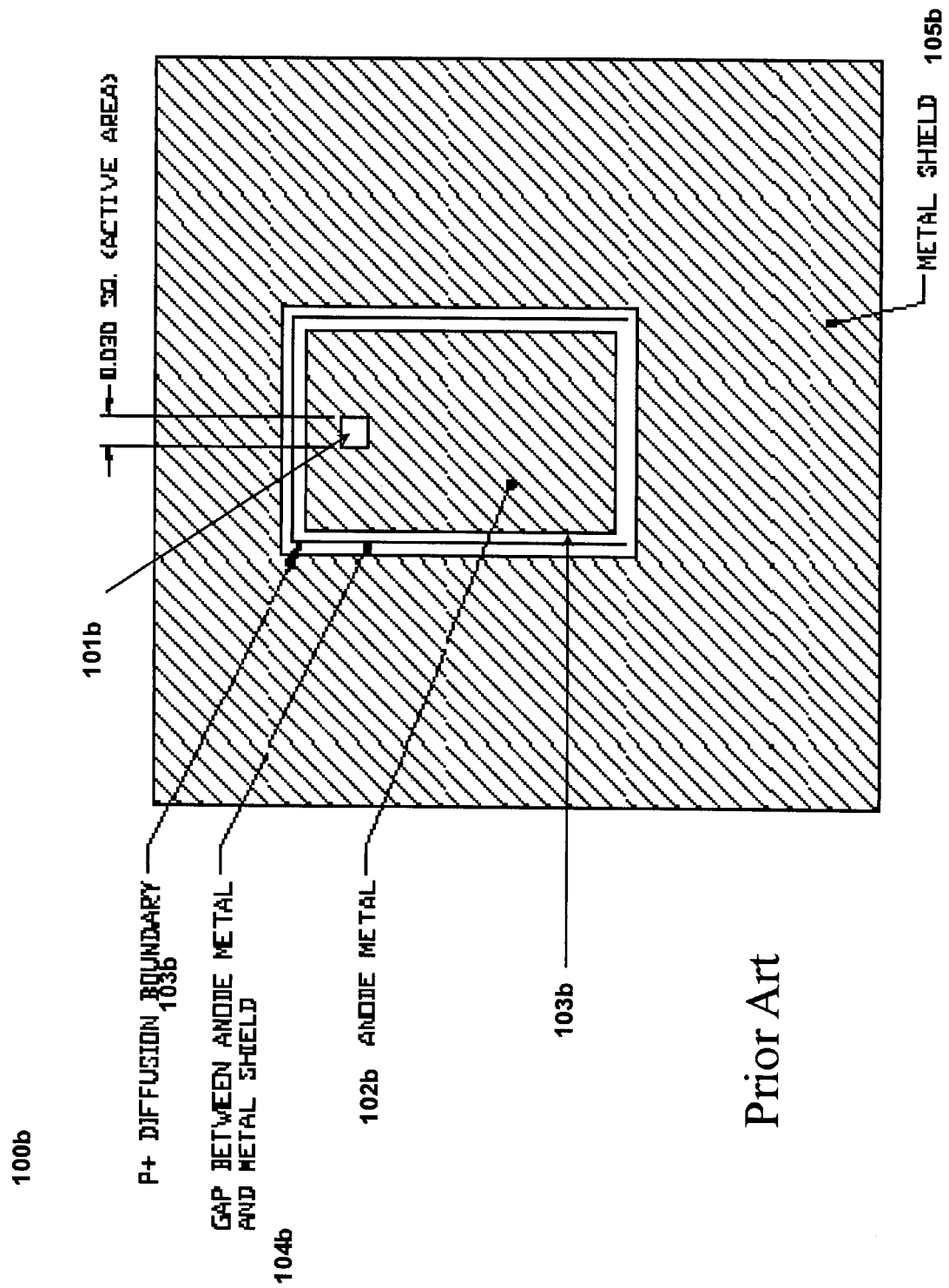
Figure 1C:
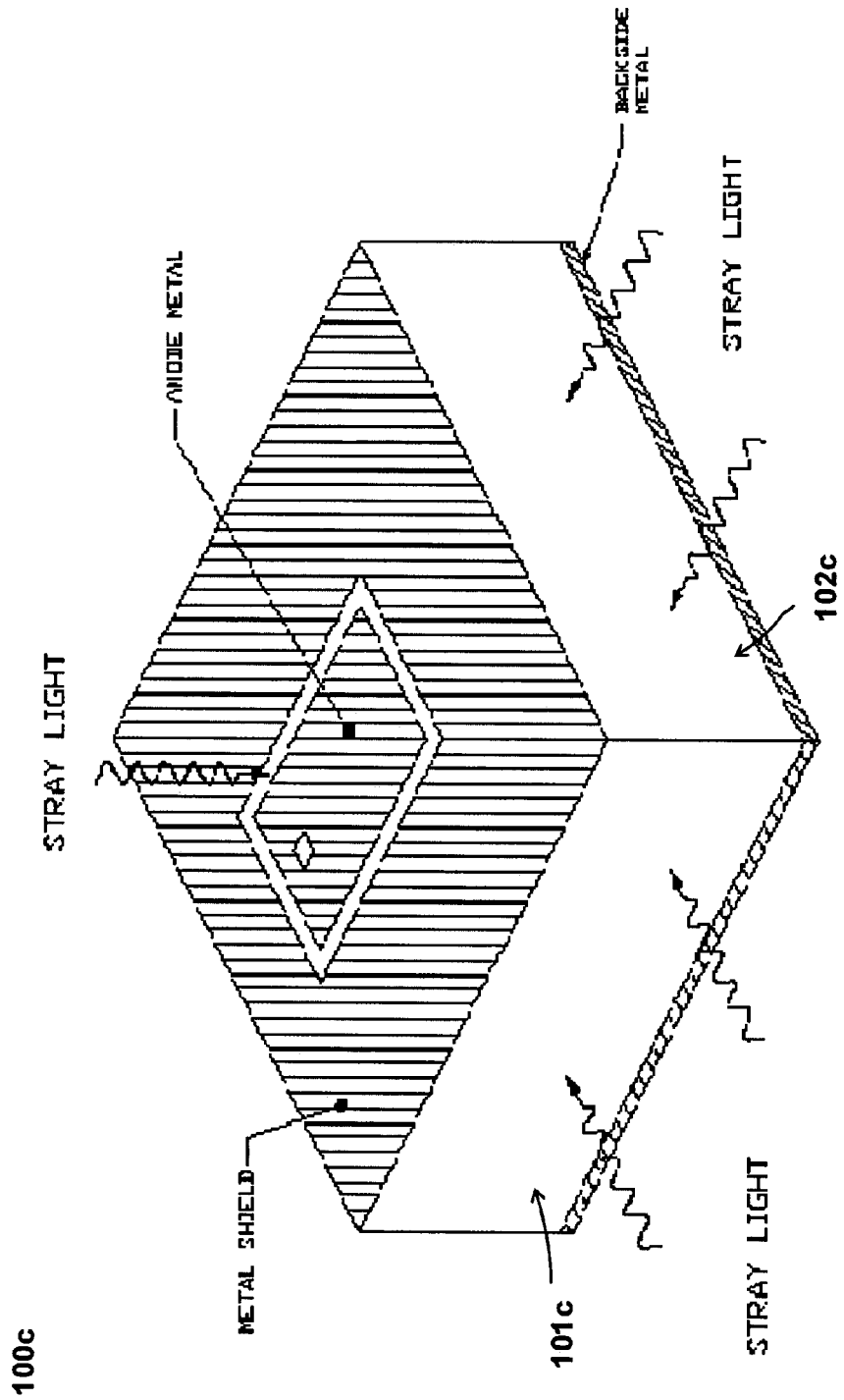
FIG. 1c is a three-dimensional perspective view of the small active area photodiode as shown in FIGS 1a and 1b.

As shown in FIGS. 1a, 1b, and 1c, an exemplary prior art photodiode comprises a 30 μm×30 μm small active area designed and fabricated using standard technology. The 30 μm×30 μm opening cut into the anode metal defines the active area. In order to prevent incident stray light from impinging on the outside areas, a metal shield is placed on the four outside borders of the p+ diffused area 104a. There is, however, a non-metallized gap between the anode metal and the metal shield. The stray light incident on this gap will result in undesired stray current. Note that if the anode metal is extended to the edges of the chip, the device has high MOS capacitance and high dark current. Another disadvantage of the standard technology of the prior art is that ambient room stray light is incident on the four edges of the chip. The resultant absorbed stray light will generate carriers, which will diffuse to the depletion region of the p+ diffuse active junction, thus producing undesired photocurrent.

Referring now to FIGS. 1a, 1b, and 1c, a conventional photodiode is described in greater detail to help elucidate its differences with the present invention. FIG. 1a depicts a cross-sectional view of a small active area photodiode wafer 101a, designed and fabricated using conventional standard technology. Wafer 101a is a photodiode chip 100a comprising four significant regions, including first region 102a, second region 103a, third region 104a, and fourth region 105a each having a thickness. The specifications, however, can be changed to suit the design, fabrication and functional requirements suggested herein. From a design standpoint the above-mentioned number of regions and their corresponding thicknesses that comprise the photodiode chip are variable and is merely illustrative of the conventional photodiode structure.

First region 102a comprises a suitable substrate material, such as bulk silicon. First region 102a may be heavily doped with a suitable impurity of a selected conductivity type, such as p-type or n-type. For example, first region 102a may possess the following specifications: conductivity of the dopant n-type, thickness 0.400 mm, and resistivity 10-10,000 Ohm cm. First region 102a also comprises the substrate layer, which further comprises sub-regions 106a and 107a. Sub-region 106a is a diffused region, heavily doped with suitable impurities or dopants of a selected conductivity type, such as p-type or n-type. For example, diffused region 106a may be heavily doped with a suitable impurity of the p-type conductivity.

Sub-region 107a is typically a depletion region or space charge region (SCR) and serves as the transition region from p-type semiconductor to n-type semiconductor in a p-n junction. The depletion region is an area in which mobile charge carriers have been substantially swept out by an electrical field and hence depleted of carriers. More specifically, the depletion region of a p-n junction in a radiation detector is a region in which the potential energies of two materials, possessing opposite conductivity types, create an energy barrier resulting in an electrical field that depletes the semiconductor of mobile charge carriers. The depletion region typically has a large electric field, large changes in hole and electron concentrations, large amounts of fixed charge, and a varying potential.

Second region 103a may be a junction passivation oxide layer, formed atop the first region 102a taking into consideration significant parameters. Third region 104a is a shielded region comprising a layer an appropriate material which serves as a protective guard against stray light that irradiates non-active areas and those areas adjacent to active areas. When stray light is absorbed by non-active areas and those areas adjacent to active areas the total photocurrent held by photodiode 100a is increased. Region 104a may be either one or a combination of a metal shield or a black polyamide layer atop region 103a.

Fourth region 105a comprises a layer of a suitable metal confined to the backside of wafer 101a. In the standard technology, a final processing step called backlapping is occasionally performed. Backlapping is the process of mechanically thinning the backside of a finished semiconductor wafer. The backside of the wafer 101a may be thinned by employing a wet abrasive solution under pressure. Subsequently, backside metallization with a metal such as gold (Au) or chromium (Cr) may be deposited on the back of the wafer 101a via sputtering or evaporation.

FIG. 1b is a top view illustration of the small active area photodiode 100a as shown in FIG. 1a, depicting photodiode 100b which comprises active area 101b, anode 102b, diffusion boundary area 103b, gap 104b, and shielded area 105b with the appropriate dimensions in accordance with the principles of the standard technology.

Active area 101b, referred to hereinafter as "small active area" or "active area", is designed and fabricated using standard technology. For example, active area photolithography may be employed to design and fabricate active area 101b.

The active area specifications, among other parameters, comprise significant performance characteristics of photodiode 100*b*.

Anode area 102*b*, comprises a suitable metal material and forms an aperture of appropriate dimension and shape. Small active area 101*b* is defined by the aperture formed by anode metal 102*b*. Diffusion boundary area 103*b*, surrounds anode metal 102*b* and is heavily doped with suitable impurities or dopants of the selected conductivity type, such as p-type or n-type. Diffusion boundary area 103*b* serves as an area where the photodiode junction is active and can convert photons thus generating current.

One particular disadvantage of fabricating and designing small active area photodiodes in the conventional technology is that gap area 104*b* located between anode area 102*b* and shielded area 105*b*, is prone to stray light absorption. Stray light incident on gap 104*b* creates undesired stray current, which is electrical current through a path other than the intended path. Another disadvantage of the conventional technology is that if anode area 102*b* is extended to the edges of the chip, it results in high MOS capacitance and high dark current.

The stray light contributes to the total photocurrent delivered by the small active area photodiode 100*b* and renders the device substantially useless. Thus, the non-active areas surrounding the active area 101*b* may generate a small photocurrent in the detector as a result of absorption of stray light. The magnitude of this photocurrent is dependent upon many parameters, such as the wavelength of the radiation, the applied bias, and the amount of and distance from incident light on active area 101*b*.

Shielded area 105*b* blocks stray light incident on the non-active area and in the vicinity of the small active area 101*b*. Shielded area 105*b* may be fabricated utilizing suitable material for blocking stray light from being absorbed into a non-active area. For example, a metal shield and/or a black polyamide layer can be put on the non-active area as a part of the semiconductor wafer process.

FIG. 1*c* is three-dimensional perspective view of the small active area photodiode as shown in FIGS. 1*a* and 1*b*. FIG. 1*c* shows stray, and in particular ambient, light incident on the four facets of photodiode chip 100*c*. Upon absorption, the ambient light creates photocarriers that diffuse to depletion region 105*c* (not shown) and produce undesired photocurrent that contributes to the total photocurrent, thus creating a disadvantage in the current state of the art. Further, the device may comprise back surface 107*c*, which further comprises a layer of suitable metal.

Figure 2A:
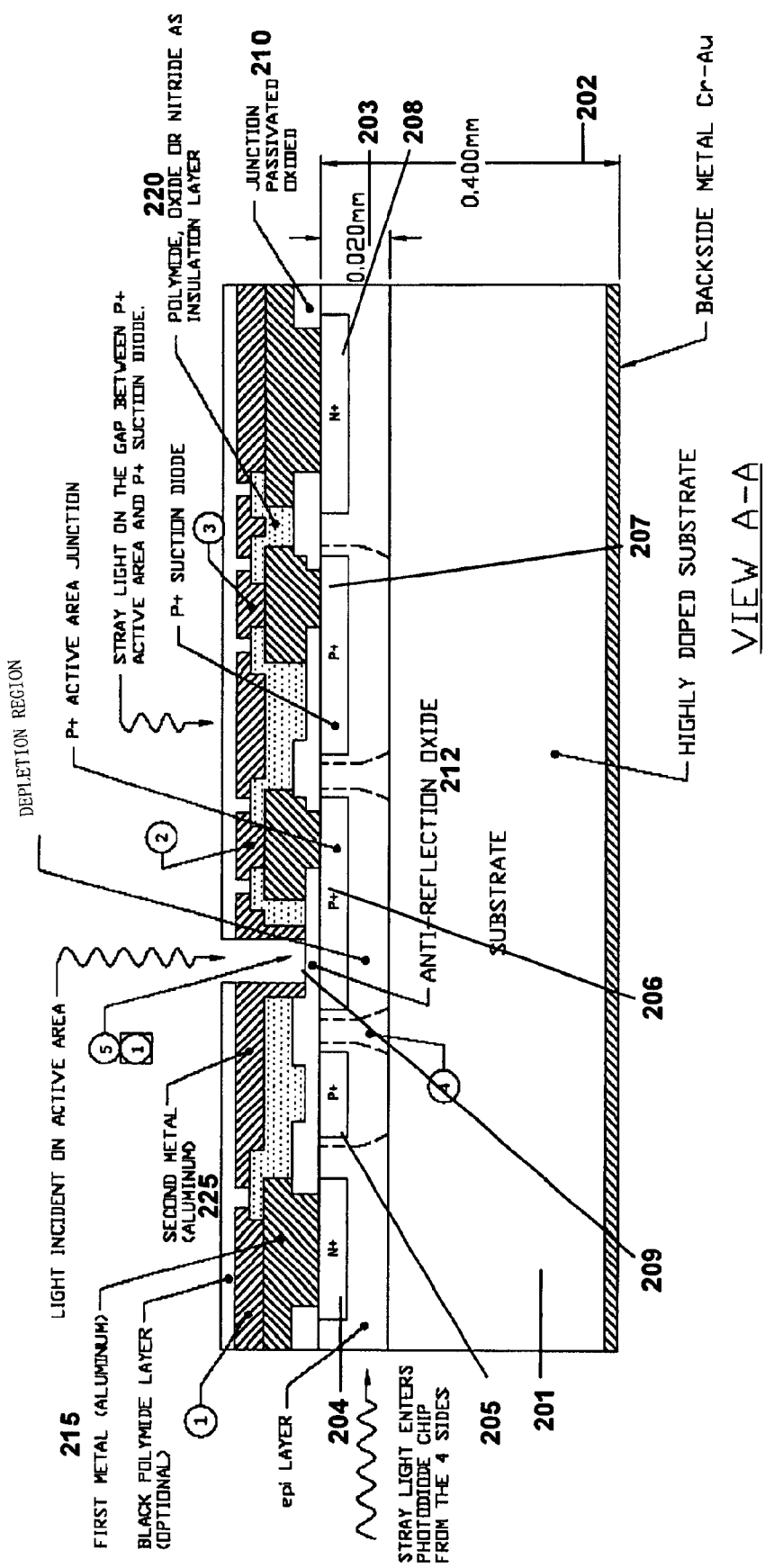
FIG. 2a depicts a cross-sectional view of one embodiment of the small active area photodiode of the present invention with special structures to substantially reduce, and preferably avoid, detection of stray light.
Figure 2B:
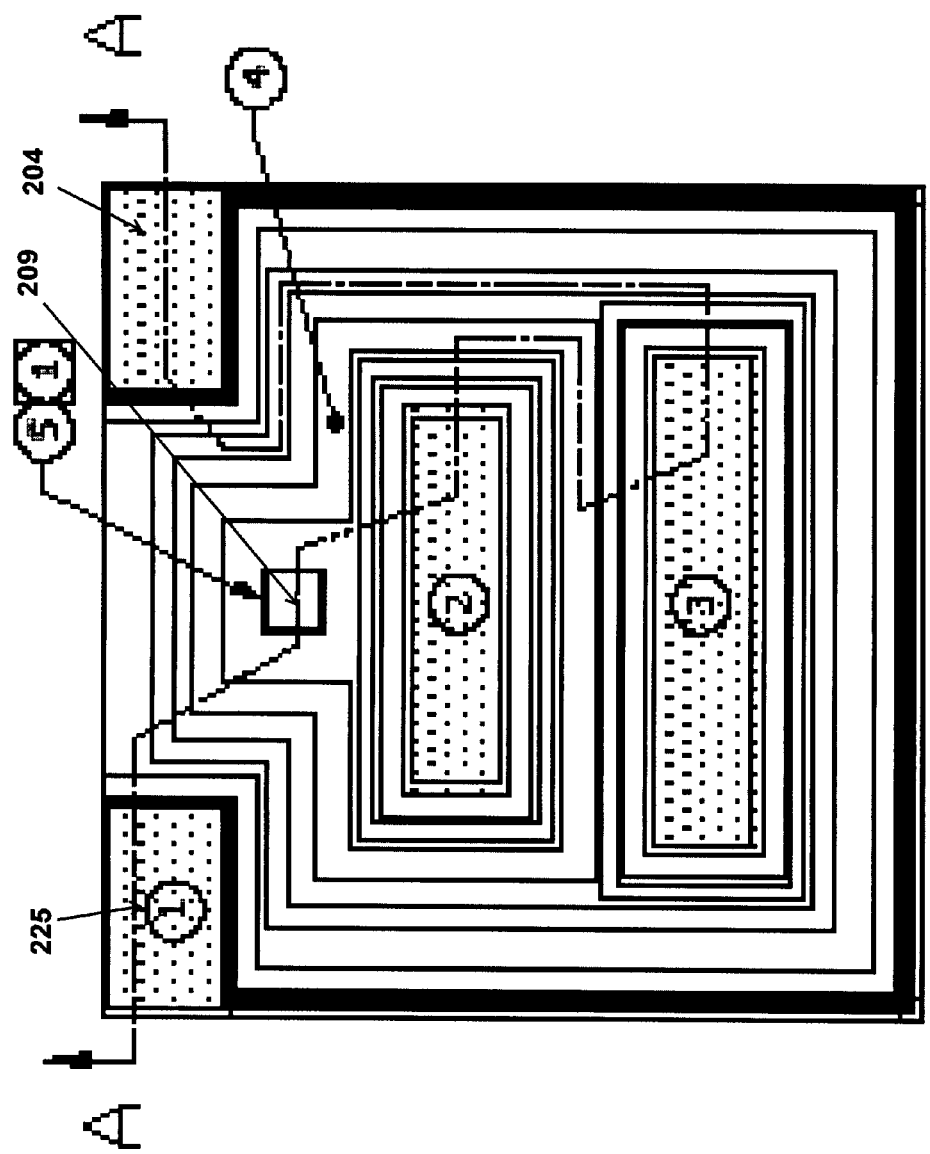
FIG. 2b depicts a top view of one embodiment of the small active area photodiode of the present invention with special structures to substantially reduce detection of stray light.
Figure 3:
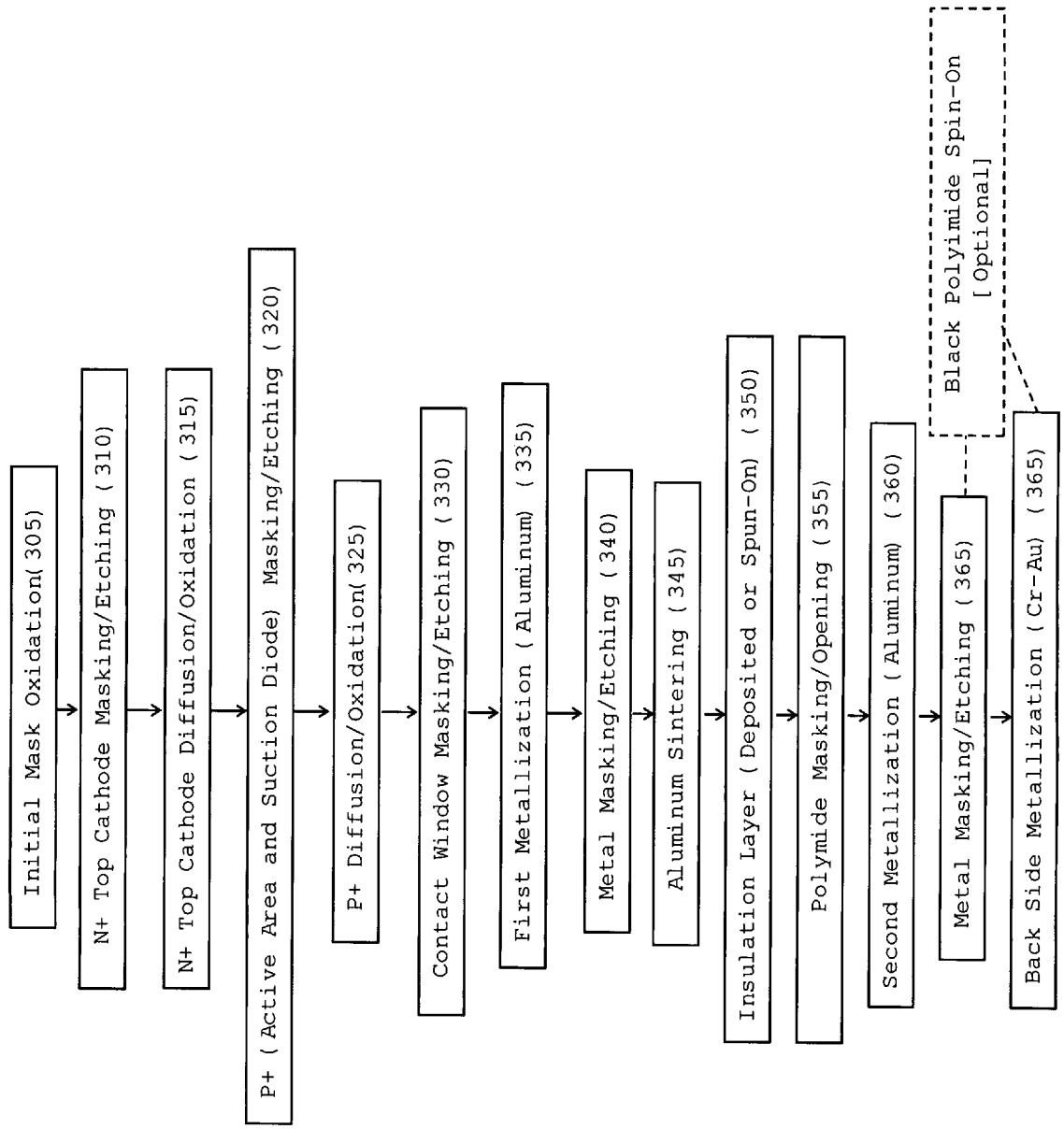
FIG. 3 is a flowchart describing one manufacturing process for the small active area photodiode of the present invention with special structures to substantially reduce detection of stray light, as shown in FIGS. 2a and 2b.

Now referring to FIGS. 2*a*, 2*b*, and 3 an embodiment of the present invention is described. In a preferred embodiment, the present invention comprises a photodiode chip with special structures to substantially reduce detection of stray light thus minimizing the generation of undesired photocurrent. The carriers generated due to the detection of stray light incident on a photodiode, either from ambient light or outside, contribute to the generation of undesired photocurrent. The stray light incident on the area between the p+ active area and the rest of the chip is blocked by a plurality of metal layers. The small active area is defined by the aperture formed by the second metal shield and exposes the front surface of the photodiode chip. In addition, a suction diode depletion region which surrounds the active p-n junction effectively collects all carriers generated from stray light incident at the four cutting edges of the photodiode chip.

In order to substantially reduce the detection of stray light, the device is designed and fabricated as shown in FIGS. 2*a* and 2*b*. In such device, the top cathode n+ is optional. In addition, the active area anode pad is not connected to other metal, thus eliminating high capacitance or high dark current levels. The stray light incident on the area between the p+ active area and the rest of the chip is blocked by a plurality of metal layers. More specifically, a second metal shield blocks stray light incident on the front surface of and in the vicinity of the small active area. The p+ active area junction is surrounded by the p+ suction diode junction. As mentioned above, any stray light incident at the four edges of the chip will be collected in the depletion region of the suction diodes. In one embodiment, the device is fabricated on 20 μm thick epi layer on a heavily doped substrate, thus the suction diode is fully depleted at low bias, and effectively collects all carriers generated from stray light incident at the four cutting edges of the chip.

FIG. 2*a* is a cross-sectional view of wafer 201, depicting photodiode chip 200 which comprises at least two regions in one embodiment, such as first region 202 and second region 203. The number of regions and their corresponding thickness is merely illustrative in the above example and is in no way limiting to the present invention. First region 202 comprises a heavily doped substrate. First region 202 may be heavily doped with a suitable impurity of a selected conductivity type, such as p-type or n-type. For example, but not limited to such example, first region 202 is doped with n-type conductivity and has a thickness of 0.380 mm.

Second region 203 is preferably a single crystal layer, such as but not limited to an epitaxial (epi) layer, formed on the top surface of first region 202 using suitable epitaxy methods. Significant parameters, such as but not limited to material of the epi layer and conductivity type and doping level of the epi layer are taken into consideration. For example, but not limited to such example, second region 203 may be doped with n-type conductivity and have a thickness of 0.020 mm.

As described above, typically, the epitaxial layer has a doping level and/or conductivity type independent of the substrate upon which the epitaxial layer is formed. In some situations the epitaxial layer is of a completely different type of material than the substrate upon which it is grown. The epitaxy process has been described above with reference to the prior art and will not be repeated in this section.

Second region 203 also comprises several diffused sub-regions 204, 205, 206, 207 and 208, which are diffused into the epi layer. In a preferred embodiment, diffused sub-regions are heavily doped with suitable impurities or dopants of the selected conductivity type, such as p-type or n-type. Preferably, diffused sub-regions 204 and 208 are heavily doped with a suitable impurity of n-type conductivity, whereas sub-region 205, 206 and 207, are heavily doped with a suitable impurity of p-type conductivity. The n+ layer is in electrical communication with a metal to form a cathode. The diffused p+ portions are in electrical communication with a metal to form an anode. Thus, diffused sub-regions 204 and 208 form part of the optional n+ doped top cathodes. Depletion regions (shown in FIG. 2*a* with dotted lines) engulf an area formed from the borders and below diffused sub-regions 205, 206 and 207. Thus, diffused sub-regions which form depletion regions also form p+ suction diodes. As mentioned above, the depletion region within the epi layer is that region wherein mobile carriers have been substantially swept out via the formation of an electric field due to the active p-n junction. The suction diode depletion region surrounds the active p-n junction and collects incident stray light from the four cutting edges of the photodiode chip 200. If detected, the stray light would generate carriers thus contributing to undesired photocurrent.

Opening or aperture 209 defines a small active area of the photodiode 200. This formation of this small active area will be discussed in further detail below with reference to FIG. 3, the flowchart describing the manufacturing process of the photodiode. Aperture 209 is formed from walls created by the second metal layer 225, also described below.

Protective layer 210 results from subjecting substrate wafer 201 to an initial mask oxidation. For example, and not limited to such example, a semi-insulating polycrystalline silicon (i.e. SIPOS) layer or film is obtained by adding oxygen or nitrogen to silicon during growth. The use of SIPOS is preferred for junction passivation. To form protective layer 210, substrate wafer 201 is partially covered at selected areas by a protective layer oxidation mask. Preferably, but not limited to such example, silicon nitride is used as an oxidation mask. Oxidation masking is well-known to those of ordinary skill in the art and will not be discussed in further detail.

After the diffusion step to form the p-n junction, an anti-reflective oxide or nitride layer 212 is thermally grown or deposited on the active area. First metal layer 215 is preferably aluminum and fills those portions of substrate wafer 201 not coated with oxide or nitride layer 212. In addition, portions of first metal layer 215, as shown in FIG. 2a, overhang and cover layer 210. Polyimide or PECVD low temperature oxide or nitride is used to form insulation layer 220. Insulation layer 220 covers those portions of layer 210 that are not coated with the first metal layer 215.

Second metal layer 225 is an additional layer used to shield against stray light incident on the front surface of and in the vicinity of small active area 209. Small active area 209 is defined by an aperture into second metal layer 225, which is confined to the front surface of photodiode chip 100. Optionally, a black polyamide layer may be coated on the top surface of the second metal layer to reduce the reflectance of light on the second metal layer.

Various modifications to the design and specifications disclosed above will be readily apparent to those of ordinary skill in the art. Thus, the particular embodiment and design approach disclosed above is in no way intended to be limiting and other possible modifications to the current design approach may be easily adopted while still adhering to the spirit and scope of the present invention and the claims appended hereto.

Referring now to FIG. 2b, an expanded cross-sectional view of a preferred embodiment of the small active area photodiode of the present invention with special structures to substantially reduce detection of stray light is depicted. FIG. 2b shows, in a cross-sectional view optional n+ top cathode 204, small active area 209, and second metal layer 225.

FIG. 3 shows flowchart 300 describing one preferred manufacturing process for the small active area photodiode of the present invention with special structures to substantially reduce detection of stray light, as shown in FIGS. 2a and 2b. Reference will be made to the layers represented in FIGS. 2a and 2b where appropriate.

In an exemplary embodiment, but not limited to such example, the start material is a round sliced wafer comprised of a suitable semiconductor material. For example, a silicon wafer may be used in accordance with the principles of the present invention. In one preferred embodiment, the wafer or semiconductor device 201 has a thickness of 0.380 mm and is heavily doped with a dopant of n-type conductivity. The above specifications are not limiting and may be modified to suit design, fabrication and functional requirements. A relatively thin epi layer 203, having high resistivity is grown on substrate wafer 201.

As shown in step 305, substrate wafer 201 coated with epi layer 203, is subjected to an initial mask oxidation that results in the formation of a protective layer on epi layer 203. For example, and not limited to such example, a semi-insulating polycrystalline silicon (i.e. SIPOS) layer or film is obtained by adding oxygen or nitrogen to silicon during growth. The use of SIPOS is preferred for junction passivation. In step 305, epi layer 203 is partially covered at selected areas by a protective layer oxidation mask. As a result, the protective layer grows only in those areas upon which layer 203 has been left unmasked. Preferably, but not limited to such example, silicon nitride is used as an oxidation mask. Oxidation masking is well-known to those of ordinary skill in the art and will not be discussed in further detail.

In step 310, n+ top cathode masking/etching occurs and is shown as layers 204 and 208 in FIG. 2a. Thus, suitable n+ layers are formed at select regions of the epi layer 203. This process is followed by selective etching. The process of masking and selective etching is well-known to those of ordinary skill in the art and will not be described in further detail herein.

In step 315, regions 204 and 208, which form part of the n+ top cathodes, are optionally subjected to controlled n+ diffusion. There are many approaches to this diffusion process possible as are well known to those of ordinary skill in the art and will not be discussed in further detail herein. It is noted however, that the choice of diffusion method is dependent on various factors, including, but not limited to the diffusion coefficient of the dopant, permissible error in diffusion depth, and diffusion source.

Once the optional n+ top cathode diffusion is complete, p+ active area and p+ suction diode masking/etching is performed in step 320. Suitable p+ masks are concurrently applied on the top surface of regions designated as 206 and 207 in FIG. 2a. Regions 206 and 207 constitute part of the p+ active area and p+ suction diodes not yet formed. Epi layer 203 on wafer 201 is coated with the protective layer subsequently subjected to selective etching, using the p+ mask to ensure certain regions retain the protective SiO$_2$ layer. Many approaches to this masking and etching technique are possible and are well known to those of ordinary skill in the art. They will not be discussed in further detail herein, except in a particular embodiment for reference purposes only and not limiting example.

Preferably, a p+ masking process is employed in step 320. The process involves first producing a photographic mask of the desired pattern or grid. Preferably, photomasks are high precision plates containing microscopic images of electronic circuits or patterns (also referred to as the geometry of the mask), made from flat pieces of quartz or glass with a layer of chrome on one side. A portion of an electronic circuit or pattern in etched in the chrome. Typically, p+ masks in the desired geometry are pre-formed for implantation onto a wafer. It should be obvious to one of ordinary skill in the art that other appropriate patterning and masking techniques may be used without departing from the scope of the present invention.

In step 325, regions 206 and 207 within the epi layer, masked and etched in step 320, are subjected to p+ diffusion/oxidation. Preferably, a suitable p+ dopant in a gas, liquid, or solid is employed. There are many approaches to this diffusion process possible as are well known to those of ordinary skill in the art and will not be discussed in further detail herein. It is noted however, that the choice of diffusion method is dependent on various factors, including, but not limited to the diffusion coefficient of the dopant, permissible error in diffusion depth, and diffusion source. For example, but not limited to such example, the p+ dopant employed in step 325 of the present invention is boron. Boron is the only p-type dopant widely used in silicon device manufacturing.

In step 330, a protective layer is patterned and etched using a contact window mask to provide contact openings for the n+ top cathodes and anodes for the p+ active area and the p+ suction diode.

Following removal of the contact window mask, in step 335, the protective layer is subjected to metallization. The selected metal is suitable for the formation of anode and cathode contacts for the photodiode chip 200 in FIG. 2a of the present invention. A first layer of metal is deposited on the entire surface of the protective layer. Upon further processing, as will be discussed in greater detail below, the first layer of metal serves as contacts for the optional n+ top cathodes on sub-regions 204 and 208 as well as for the anodes on the p+ active area and the p+ suction diode on regions 206 and 207, respectively. While it is preferred that the first metal be comprised of aluminum, one of ordinary skill in the art would appreciate that any suitable metal, which can be processed in accordance with step 335, may be used.

In step 340, after the completion of aluminum metallization in step 335, the first layer of metal is masked and selectively etched. First, a mask is applied on the first metal layer. Subsequent to application of the mask, the chip is selectively etched, as can be seen in FIG. 2a.

In general, the structure of a monolithic integrated circuit comprises a small plate, or chip, of a semiconductor material wherein the various active and passive circuit components are formed. The components are interlinked by a connection arrangement provided in a predetermined number of link levels or planes, which are isolated from one another by layers of a dielectric material. Typically, the first or innermost level in the structure is the diffusion or junction level, and comprises a suitably doped substrate of crystalline silicon. Because it is formed by shaping a layer of metal, such as aluminum, on the integrated circuit surface, the topmost level is referred to as the metallization level. Contacts are formed on this topmost layer for electrically connecting the integrated circuit to its surroundings.

Proper functionality of an integrated circuit is associated with the method of linking junction (innermost) level to the metallization (topmost) level. As is known to those of ordinary skill in the art, linking must occur at a predetermined fixed signal voltage or "threshold", and becomes more critical to achieve as its size decreases. In order to achieve this requirement, it is current practice to treat via "aluminum annealing" or "aluminum sintering".

In step 345, the aluminum metallization is subjected to "aluminum sintering". "Aluminum sintering" is a process in which fine particles of a material are chemically bonded at a temperature that is sufficient for atomic diffusion. The process of "aluminum sintering" is well-known to those of ordinary skill in the art and will not be discussed in further detail herein. "Aluminum sintering" ensures proper electrical operation at the links between the metallization (topmost) and junction (innermost) levels by both lowering the resistance of the aluminum-silicon contact and reducing the residual valence forces present at the interface of the silicon crystal lattice.

In step 350 of the present invention, a polyimide coating is preferably "spin-coated" on the substrate, but not limited to such application technique. The spin-coating technique is well known to those of ordinary skill in the art and will not be discussed in further detail. Other application techniques that have been used include draw, spray, extrusion, roller, dip and drop coating. For optimal adhesion to silicon, oxides, and most metal, it is preferred that the polyimide coating be used in conjunction with adhesion promoters. Some polyimides contain adhesion promoters, while others require the application of a separate adhesion promoter or coupler prior to polyimide application. When used separately, adhesion promoters are also preferably applied by spin coating.

In step 355 of the present invention, after spin-coating the substrate with the polyimide layer, a mask is applied. The patterning techniques as they relate to masking polyimide layers are well known in the art and will not be discussed in greater detail. It should be noted, however, that polyimide photolithographic processes include, but may not be limited to, the conventional polyimide process which uses a non-photosensitive polyimide and the simplified photosensitive polyimide process which uses a photodefinable or photosensitive polyimide. The insulating polyimide layer is then appropriately "etched" to create and opening to the small active area. Optionally, as an alternative to the polyimide layer, a low temperature oxide or nitride can be used. After the PECVD deposition of the low temperature oxide or nitride, standard photolithography techniques and standard etching technology are used to remove the dielectric material from undesired areas.

In step 360, the wafer is subjected to a second metallization. A second metal layer, preferably but not limited to aluminum, is deposited onto the wafer. The metallization process has already been described above with reference to step 335 and will not be discussed in further detail.

Subsequent to the aluminum metallization step, the metal is subjected to a masking and etching process in step 365. The masking and etching process requires careful selection and usage of an appropriate metal-containing masking material in combination with a complimentary plasma etchant. The byproduct produced by a combination of the metal with the reactive plasma etchant species must be essentially non-volatile under etch process conditions, and sufficiently non-corrosive to features on the substrate being etched, such that the substrate remains unharmed by the etch process. Although aluminum is a preferred metal for the metal-comprising mask, other metals can be used for the masking material, as long as they produce an essentially non-volatile, non-corrosive etch byproduct under etch process conditions. For example, and not limited to such example, metallic materials recommended for the mask include aluminum, cadmium, copper, chromium, gallium, indium, iron, magnesium, manganese, nickel, and alloys thereof.

In one embodiment, a metal alloy such as aluminum in combination with copper or magnesium is used, wherein the copper or magnesium content is less than approximately 8% by weight and other constituents total less than about 2% by weight. The plasma feed gas includes at least one fluorine-containing compound such as, but not limited to, nitrogen trifluoride ($NF_3$), carbon tetrafluoride ($CF_4$), and sulfur hexafluoride ($SF_6$). Hydrogen bromide (HBr), Oxygen ($O_2$), or an oxygen-containing compound, or combination thereof may optionally be added to the plasma feed gases to help provide a protective layer thereby assisting in profile control of the etched feature.

Typically, metal-containing mask material etches more slowly than the silicon etch rate, thus ensuring that the etch by-products formed do not harm the etched semiconductor structure or features contained therein. Further, it has been disclosed that if the etch byproducts from the metal-comprising masking material are sufficiently non-volatile, they can be used as "stop" etchants to limit the etch rate of the masking material, thus providing an etch selectivity of silicon relative to the metal-containing masking material in a ratio better than 40:1.

Finally, in step 370, the backside of the substrate wafer is metallized, in a process sometimes referred to as "backlapping". Backlapping is the process of mechanically thinning the backside of a finished semiconductor wafer. The backside of the wafer may be lapped or ground down using a wet abrasive solution under pressure. In a preferred embodiment, a chromium-gold (Cr—Au) alloy is deposited on the backside of the wafer via a process called "sputtering".

Various modifications to the manufacturing process, disclosed above, will be readily apparent to those of ordinary skill in the art. Thus, this process is in no way intended to be limiting and those other possible modifications to the current manufacturing process may be easily adopted while still abiding by the spirit and scope of the present invention and the claims appended hereto. It should be understood that the present invention may be modified to incorporate other possible embodiments.

The above examples are merely illustrative of the many applications of the system of present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A photodiode comprising:
   a front side;
   a plurality of electrical contacts in electrical communication with said front side;
   a first region wherein said first region is doped with an impurity of a first conductivity type; and
   a second region wherein said second region comprises a layer having a plurality of regions which are doped with alternating conductivity types wherein said plurality of regions doped with alternating conductivity types create at least one depletion region that functions as a suction diode, wherein the fabrication of said array involves a masking process comprising the steps of:
   applying a n+ mask on said front side
   applying a p+ mask on said front side,
   applying a first metal layer on said front side,
   applying an insulation layer on said front side, and
   applying a second metal layer on said front side.

2. The array of claim 1 wherein the masking process further comprises etching said second metal layer to form an aperture leading to an active area on said photodiode.

3. The array of claim 2 wherein said second metal layer prevents stray light from impinging on areas surrounding the active area.

4. The array of claim 1 wherein said front layer comprises a doped material of n+ conductivity type.

5. The array of claim 4 wherein said front n+ layer is in electrical communication with a metal to form a cathode.

6. The array of claim 1 wherein said front layer comprises a doped material of p+ conductivity type.

7. The array of claim 6 wherein front p+ layer is in electrical communication with a metal to form a cathode.

8. The array of claim 1 wherein said insulation layer is a polymide.

9. The array of claim 1 further comprising a first metallization layer on said front side and a second metallization layer on said front side.

10. The array of claim 9, wherein said second metallization layer substantially prevents stray light from impinging upon areas surrounding an active area.

11. The array of claim 1 comprising a substrate made of n-doped silicon.

12. The array of claim 1 wherein a front surface of said suction diode is partially covered by a passivated oxidized junction, an insulating layer, and a first metal layer.

13. The array of claim 8 wherein the insulating layer is a low temperature oxide layer or nitride layer.

14. The array of claim 1 wherein said front side comprises an n+ layer in electrical communication with a metal to form a cathode.

* * * * *